United States Patent
P et al.

(10) Patent No.: US 9,240,400 B2
(45) Date of Patent: Jan. 19, 2016

(54) SCHEME TO REDUCE STRESS OF INPUT/OUTPUT (IO) DRIVER

(71) Applicant: Texas Instruments Incorporated, Dallas, TX (US)

(72) Inventors: Venkateswara Reddy P, Bangalore (IN); Vinayak Ghatawade, Bangalore (IN); Rajat Chauhan, Dehradun (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 151 days.

(21) Appl. No.: 14/043,583

(22) Filed: Oct. 1, 2013

(65) Prior Publication Data
US 2015/0092308 A1  Apr. 2, 2015

(51) Int. Cl.
H02H 9/04 (2006.01)
H02H 3/00 (2006.01)
H01L 27/02 (2006.01)

(52) U.S. Cl.
CPC .................. H01L 27/0248 (2013.01)

(58) Field of Classification Search
USPC ............................................. 361/56
See application file for complete search history.

(56) References Cited

U.S. PATENT DOCUMENTS 8,659,859 B1 * 2/2014 Zhu et al. ................. 361/56

* cited by examiner

*Primary Examiner* — Dharti Patel
(74) *Attorney, Agent, or Firm* — John R. Pessetto; Frank D. Cimino

(57) ABSTRACT

An input/output (IO) circuit is provided that reduces stress on a driver without using an additional reference voltage. The IO circuit receives an overshoot voltage and an undershoot voltage in a receive mode. The IO circuit includes a driver circuit. The driver circuit includes an NMOS transistor coupled to a PMOS transistor. A pad is coupled to the driver circuit. A PMOS protect circuit is coupled to the driver circuit and the pad. An NMOS protect circuit is coupled to the driver circuit and the pad. The NMOS protect circuit is configured to be activated only for a duration of the overshoot voltage received at the pad during the receive mode and the PMOS protect circuit is configured to be activated only for a duration of the undershoot voltage received at the pad during the receive mode.

21 Claims, 7 Drawing Sheets

SCHEME TO REDUCE STRESS OF INPUT/ OUTPUT (IO) DRIVER

TECHNICAL FIELD

Embodiments of the disclosure relate generally to integrated circuits (ICs) and more particularly to a circuitry to protect a driver in an input/output (IO) circuit.

BACKGROUND

An integrated circuit (IC) includes core logic circuits and input/output (IO) circuits. The core logic circuits perform a desired function and require a low voltage termed as core supply voltage. The IC communicates with other ICs or external devices (filters, sensors etc.) at high voltage range termed as the IO supply voltage. The IO circuits acts as interface between core logic circuits and external devices. The IO circuits are connected to external devices through board traces or metal wires, called transmission lines. An IO circuit includes a driver that drive signals on a PAD to interface with the external devices. A bidirectional IO circuit has a driver used for sending signals to the external devices (transmission mode) and a receiver for receiving signals from the external devices (receive mode). The increasing complexity and performance requirements of portable media devices call for effective IO circuits with high voltage drivers that provide the voltage transition between the IO supply voltage devices and logic circuits operating at core supply voltages. The high speed LVCMOS (low voltage complementary metal oxide semiconductor) bidirectional IOs face reliability issues arising due to the overshoot voltages and the undershoot voltages at the IO circuit interface caused by impedance mismatch between the external device and the transmission line.

The difference between the core supply voltage and IO supply voltage is large at advanced technology nodes. Hence, it is difficult to fabricate IO circuits and core logic circuits on the same IC without compromising on device density. At advanced technology nodes, the aim is to reduce the cost of the mask and increase the device density. Therefore, low voltage devices are used to fabricate IO circuits and the reliability concerns are addressed either through design engineering, device engineering or both. The IO circuit typically has a driver built from MOSFETs (Metal oxide semiconductor field effect transistors). The MOSFETs are low voltage devices and can withstand higher supply voltages received from the external devices only to an extent, and any small increase in the supply voltage thereafter results in severe reliability concerns. Hence, the overshoot voltage and the undershoot voltages at the pad during the receive mode tend to significantly overstress the MOSFETs thereby increasing the failure rate of the IC. There are several mechanisms in the literature which are used to clamp the voltages received at the pad above the rail voltages (i.e. VDDS and GND). However, these mechanisms require a reference voltage generated internally on the IC. This adds additional power consumption and complexity to the IO circuit design.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides an input/output (IO) circuit in an integrated circuit. The IO circuit includes a logic circuit. A driver circuit is coupled to the logic circuit and a pad is coupled to the driver circuit. A PMOS protect circuit is coupled to the driver circuit and the pad. An NMOS protect circuit is coupled to the driver circuit and the pad. The PMOS protect circuit and the NMOS protect circuit are activated during a receive mode of the IO circuit.

An example embodiment provides an input/output (IO) circuit in an integrated circuit that receives an overshoot voltage and an undershoot voltage in a receive mode. The IO circuit includes a driver circuit. The driver circuit includes an NMOS transistor coupled to a PMOS transistor. A pad is coupled to an output of the driver circuit. A drain terminal of the PMOS transistor and a drain terminal of the NMOS transistor are coupled to generate the output of the driver circuit. A PMOS protect circuit is coupled to the pad and a gate terminal of the PMOS transistor. An NMOS protect circuit is coupled to the pad and a gate terminal of the NMOS transistor. The NMOS protect circuit is configured to be activated only for a duration of the overshoot voltage received at the pad during the receive mode and the PMOS protect circuit is configured to be activated only for a duration of the undershoot voltage received at the pad during the receive mode.

Another embodiment provides a method for protecting an input/output (IO) circuit when functioning in a receive mode. The IO circuit includes an NMOS transistor and a PMOS transistor. An overshoot voltage and an undershoot voltage received at a pad are clamped. An NMOS protect circuit is activated for a duration of the overshoot voltage received at the pad and a PMOS protect circuit is activated for a duration of the undershoot voltage received at the pad.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
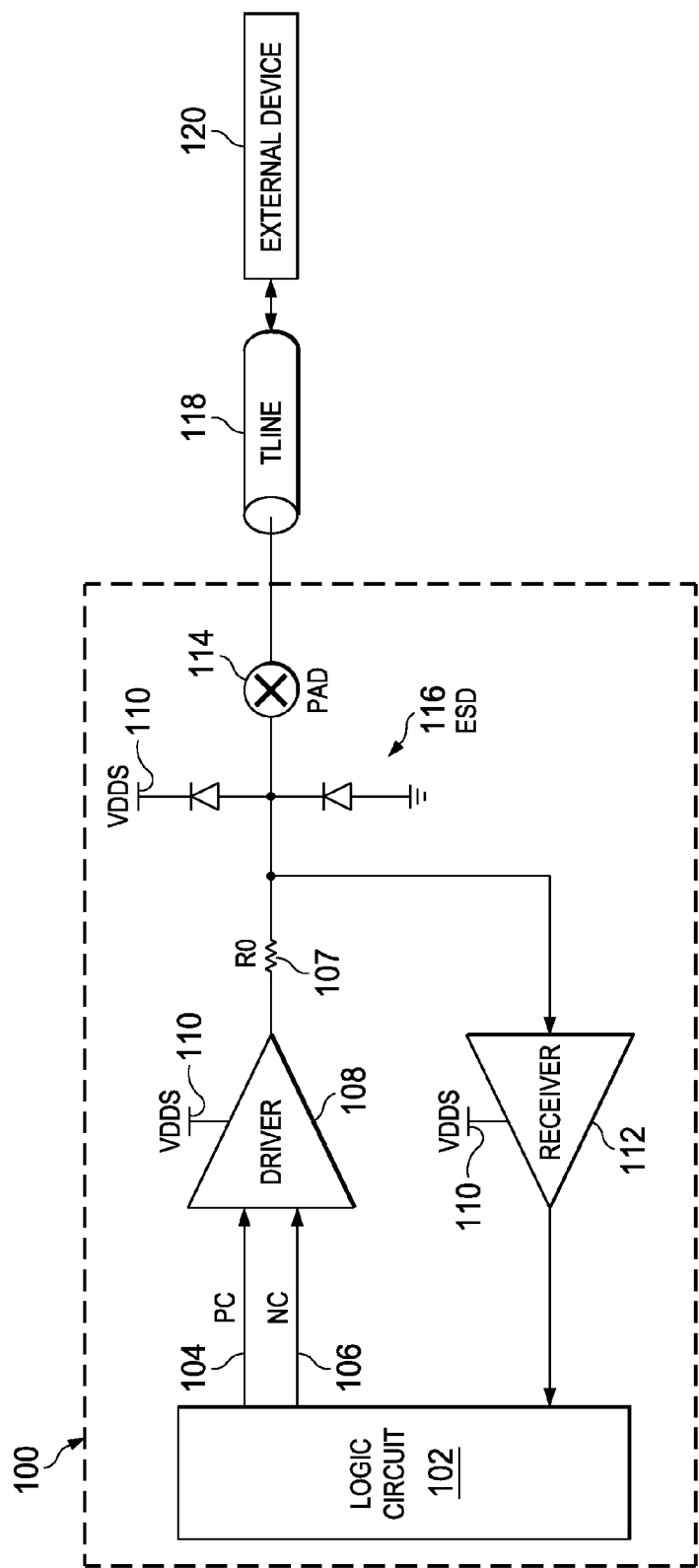
FIG. 1 illustrates a block diagram of an input/output (IO) circuit in an integrated circuit.

FIG. 1 illustrates a block diagram of an input/output (IO) circuit 100 in an integrated circuit. The IO circuit 100 is coupled to an external device 120 through the transmission line 118. The IO circuit 100 includes a logic circuit 102. The logic circuit 102 is coupled to a driver circuit 108. The logic circuit 102 is configured to provide a first output (PC) 104 and a second output (NC) 106 to the driver circuit 108. The driver circuit 108 is powered by an input/output (IO) supply voltage (VDDS) 110. A resistor (Ro) 107 is coupled to an output of the driver circuit 108. In one embodiment, the resistor (Ro) 107 is not present in the IO circuit 100. A pad 114 is coupled to the resistor (Ro) 107. A receiver 112 is coupled to the pad 114. The receiver 112 is powered by VDDS 110 and provides an output to the logic circuit 102. An ESD (electro-static discharge) clamp circuit 116 is coupled between the resistor (Ro) 107 and the pad 114. The ESD clamp circuit 116 receives VDDS 110. The transmission line 118 is coupled to the pad 114. The IO circuit 100 in one embodiment is coupled to one or more external devices.

The operation of the IO circuit 100 illustrated in FIG. 1 is explained now. The logic circuit 102 generates a first output (PC) 104 and a second output (NC) 106 which are provided to the driver 108. The driver 108 is used for sending signals to the external device 120 (Transmission mode) and a receiver 112 is used for receiving signals from the external device 120 (Receive mode). In one embodiment, in transmission mode, the receiver 112 is inactivated and in the receive mode, the driver 108 is inactivated. In another embodiment, both the driver 108 and the receiver 112 are activated during the transmission mode. The pad 114 acts as an interface between the IO circuit 100 and the external device 120. The ESD clamp circuit 116 clamps the incoming signal to a defined voltage level above rail voltages (VDDS and ground voltage (0 Volt)). However, during the mode when the IO circuit is receiving signal from the external device 120, the impedance mismatch between the external driver 120 and the transmission line 118 causes overshoot voltage and undershoot voltage at the pad 114 of the IO circuit 100. This overshoot voltage and the undershoot voltages at the pad 114 during the receive mode tend to significantly overstress the driver 108 thus reducing the reliability of the device using the IO circuit 100.

Figure 2:
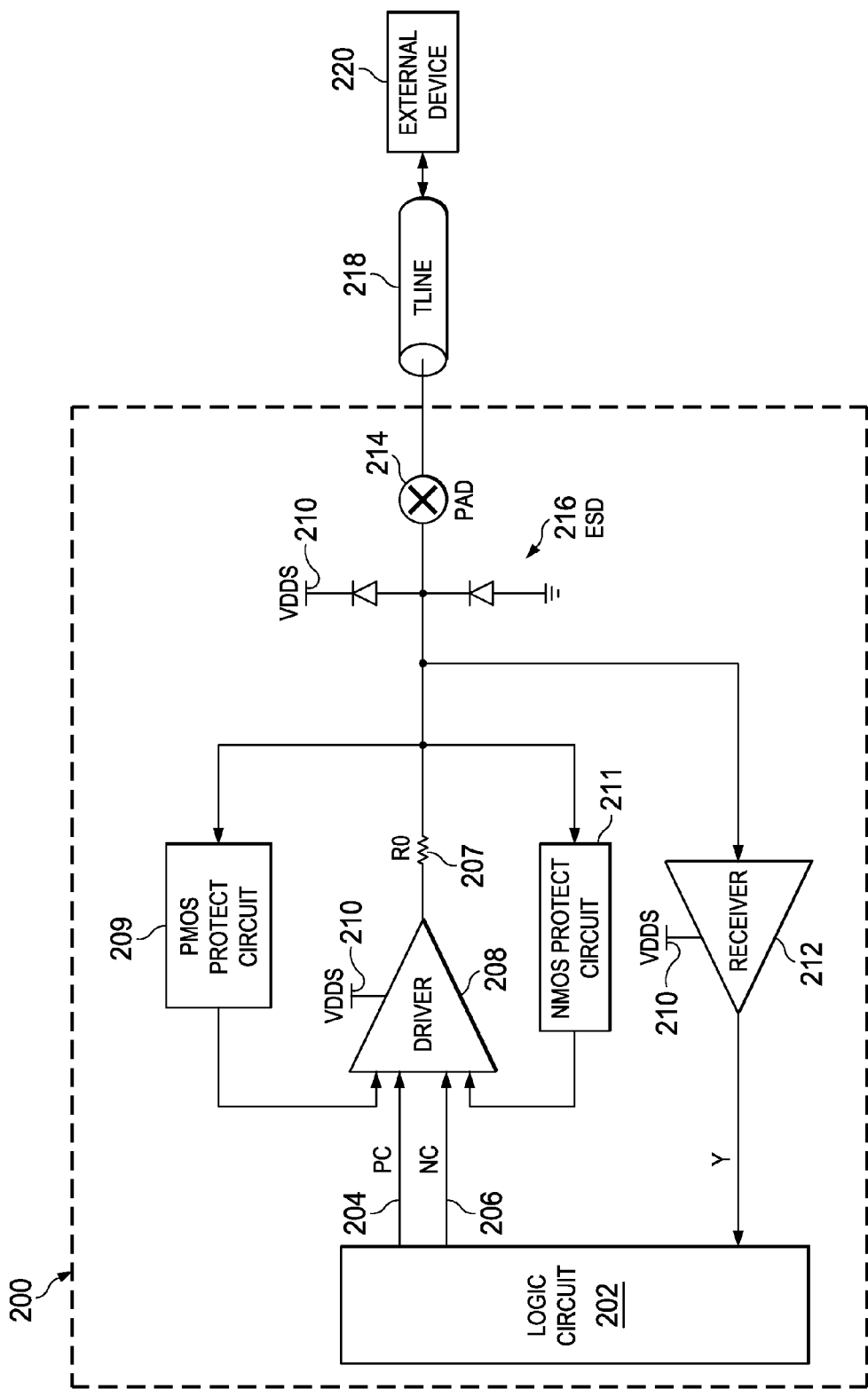
FIG. 2 illustrates a block diagram of an input/output (IO) circuit in an integrated circuit, according to an embodiment.

FIG. 2 illustrates a block diagram of an input/output (IO) circuit 200 in an integrated circuit, according to an embodiment. The IO circuit 200 is coupled to an external device 220 through the transmission line 218. The IO circuit 200 includes a logic circuit 202. The logic circuit 202 is coupled to a driver circuit 208. The logic circuit 202 is configured to provide a first output (PC) 204 and a second output (NC) 206 to the driver circuit 208. The driver circuit 208 is powered by an input/output (IO) supply voltage (VDDS) 210. A resistor (Ro) 207 is coupled to an output of the driver circuit 208. In one embodiment, the resistor (Ro) 207 is not present in the IO circuit 200. A pad 214 is coupled to the resistor (Ro) 207. A receiver 212 is coupled to the pad 214. The receiver 212 is powered by VDDS 210 and provides an output to the logic circuit 202. A PMOS (p-metal oxide semiconductor) protect circuit 209 is coupled to the pad 214 and the driver circuit 208. An NMOS (n-metal oxide semiconductor) protect circuit 211 is coupled to the pad 214 and the driver circuit 208. An ESD (electro-static discharge) clamp circuit 216 is coupled to the pad 214. The ESD clamp circuit 216 receives VDDS 210. The transmission line 218 is coupled to the pad 214. The IO circuit 200 in one embodiment is coupled to one or more external devices. The IO circuit 200 may include one or more additional components known to those skilled in the relevant art and are not discussed here for simplicity of the description.

The operation of the IO circuit 200 illustrated in FIG. 2 is explained now. The logic circuit 202 generates a first output (PC) 204 and a second output (NC) 206 which are provided to the driver 208. The driver 208 is used for sending signals to the external device 220 (Transmission mode) and a receiver 212 is used for receiving signals from the external device 220 (Receive mode). In one embodiment, in transmission mode, the receiver 212 is inactivated and in the receive mode, the driver 208 is inactivated. In another embodiment, both the driver 208 and the receiver 212 are activated during the transmission mode. The pad 214 acts as an interface between the IO circuit 200 and the external device 220. The ESD clamp circuit 216 clamps a received signal to a defined voltage level above rail voltages (VDDS and ground voltage (0 Volt)). In one embodiment, the ESD clamp circuit 216 clamps a received signal to a threshold voltage of ESD diodes which are used for constructing the ESD clamp circuit 216. During the receive mode, when the driver 208 is inactivated, the impedance mismatch between the external device 220 and the transmission line 218 causes overshoot voltage and undershoot voltage at the pad 214 of the IO circuit 200. These overshoot and undershoot voltages creates an electric field at the driver that significantly overstress the driver 208 thereby reducing the reliability of the IO circuit 200. The PMOS protect circuit 209 and the NMOS protect circuit 211 are configured to protect the driver 208 from the overshoot voltage and the undershoot voltage in the received signal at the pad 214 of the IO circuit 200. The NMOS protect circuit 211 is configured to be activated only for a duration of the overshoot voltage during the receive mode and the PMOS protect circuit 209 is configured to be activated only for a duration of the undershoot voltage during the receive mode. The undershoot voltage is a voltage below a negative predefined threshold and the overshoot voltage is a voltage above a positive predefined threshold. In one embodiment, the positive predefined threshold is equal to the IO supply voltage (VDDS) 210 and the negative predefined threshold is equal to ground voltage (0V). The PMOS protect circuit 209 suppresses the undershoot voltage and the NMOS protect circuit 211 suppresses the overshoot voltage, thus eliminating the stress caused on the driver 208. One of the advantage of the IO circuit 200 is that the undershoot voltage suppression and the overshoot voltage suppression does not require additional reference voltage. The functioning of the IO circuit 200 is further explained with the help of FIG. 3.

Figure 3:
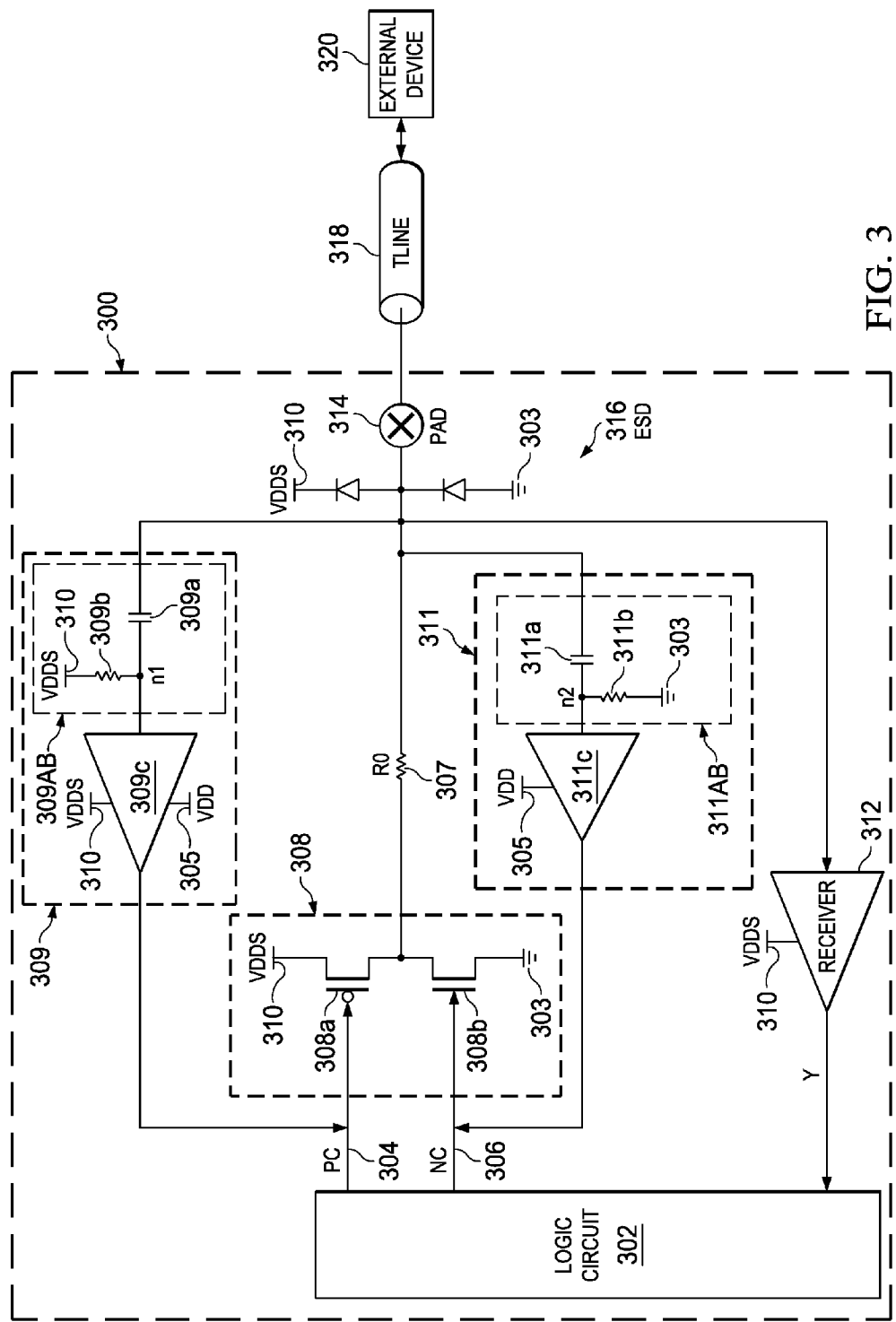
FIG. 3 illustrates a circuit schematic of an input/output (IO) circuit in an integrated circuit, according to an embodiment.

FIG. 3 illustrates a circuit schematic of an input/output (IO) circuit 300 in an integrated circuit, according to an embodiment. The IO circuit 300 is circuit schematic of the block diagram of the input/output (IO) circuit 200 illustrated in FIG. 2. It is to be noted that the IO circuit 200 may be implemented in other ways using other circuit components and IO circuit 300 is one of the many ways of implementing IO circuit 200. The IO circuit 300 is coupled to an external device 320 through the transmission line 318. The IO circuit 300 includes a logic circuit 302. The logic circuit 302 is coupled to a driver circuit 308. The driver circuit 308 includes a PMOS transistor 308a and an NMOS transistor 308b. The logic circuit 302 is configured to provide a first output (PC) 304 at a gate terminal of the PMOS transistor 308a and a second output (NC) 306 at a gate terminal of the NMOS transistor. A source terminal of the PMOS transistor 308a is coupled to an input/output (IO) supply voltage (VDDS) 310 and a source terminal of the NMOS transistor 308b is coupled to the ground terminal 303. In one embodiment, a bulk terminal of the PMOS transistor is connected to VDDS 310. The ground terminal offers a ground voltage of 0 Volt. In one embodiment, the ground terminal is at defined voltage level other than 0V. A drain terminal of the PMOS transistor 308a and a drain terminal of the NMOS transistor 308b are coupled to provide an output of the driver circuit 308. A resistor (Ro) 307 is coupled to the output of the driver circuit 308. In one embodiment, the resistor (Ro) 307 is not present in the IO circuit 300. A pad 314 is coupled to the resistor (Ro) 307. A receiver 312 is coupled to the pad 314. The receiver 312 is powered by VDDS 310 and provides an output to the logic circuit 302. A PMOS (p-metal oxide semiconductor) protect circuit 309 is coupled to the pad 314 and the driver circuit 308. An NMOS (n-metal oxide semiconductor) protect circuit 311 is coupled to the pad 314 and the driver circuit 308. The PMOS protect circuit 309 is coupled to the pad 314 and the gate terminal of the PMOS transistor 308a and the NMOS protect circuit 311 is coupled to the pad 314 and the gate terminal of the NMOS transistor 308b. The PMOS protect circuit 309 includes an RC high pass filter 309AB. The RC high pass filter 309AB includes a capacitor 309a and a resistor 309b. The capacitor 309a is coupled to the pad 314. A node n1 is coupled to the capacitor 309a. The resistor 309b is coupled to the node n1. The resistor 309b is also coupled to VDDS 310. A buffer 309c is coupled to the node n1 and an output of the buffer 309c is provided to the gate terminal of the PMOS transistor 308a. The buffer 309c is configured to receive VDDS 310 and a core supply voltage (VDD) 305. The IO circuit 300 may include one or more additional components known to those skilled in the relevant art and are not discussed here for simplicity of the description.

The NMOS protect circuit 311 includes an RC high pass filter 311AB. The RC high pass filter 311AB includes a capacitor 311a and a resistor 311b. The capacitor 311a is coupled to the pad 314. A node n2 is coupled to the capacitor 311a. The resistor 311b is coupled to the node n2. The resistor 311b is also coupled to the ground terminal 303. A buffer 311c is coupled to the node n2 and an output of the buffer 311c is provided to the gate terminal of the NMOS transistor 308b. The buffer 311c is configured to receive the core supply voltage (VDD) 305. An ESD (electro-static discharge) clamp circuit 316 is coupled to the pad 314. The ESD clamp circuit 316 receives VDDS 310. The transmission line 318 is coupled to the pad 314. The IO circuit 300 in one embodiment is coupled to one or more external devices.

The operation of the IO circuit 300 illustrated in FIG. 3 is explained now. The logic circuit 302 generates a first output (PC) 304 and a second output (NC) 306 which are provided to the driver 308. The driver 308 is used for sending signals to the external device 320 (Transmission mode) and a receiver 312 is used for receiving signals from the external device 320 (Receive mode). In one embodiment, in transmission mode, the receiver 312 is inactivated and in the receive mode, the driver 308 is inactivated. In another embodiment, both the driver 308 and the receiver 312 are activated during the transmission mode. Thus, in receive mode, the first output (PC) 304 and the second output (NC) 306 from the logic circuit 302 to the driver 308 are inactivated. The pad 314 acts as an interface between the IO circuit 300 and the external device 320. The resistor (Ro) 307 is used to control an impedance of the driver 308. The ESD clamp circuit 316 clamps a received signal to a defined voltage level above rail voltages (VDDS and ground voltage (0 Volt)). In one embodiment, the ESD clamp circuit 316 clamps a received signal to a threshold voltage of ESD diodes which are used for constructing the ESD clamp circuit 316. During the receive mode, when the driver 308 is inactivated, the impedance mismatch between the external device 320 and the transmission line 318 causes overshoot voltage and undershoot voltage at the pad 314 of the IO circuit 300. These overshoot and undershoot voltages creates an electric field at the driver 308 that significantly overstress the driver 308 thereby reducing the reliability of the IO circuit 300. The PMOS protect circuit 309 and the NMOS protect circuit 311 are configured to protect the driver 308 from the overshoot voltage and the undershoot voltage in the received signal at the pad 314 of the IO circuit 300. The NMOS protect circuit 311 is activated only for a duration of the overshoot voltage during the receive mode and the PMOS protect circuit 309 is activated only for a duration of the undershoot voltage during the receive mode.

During receive mode, the first output (PC) 304 from the logic circuit 302 to the PMOS transistor 308a is inactivated. In the PMOS protect circuit 309, in an embodiment; the resistor 309b is of the order of mega-ohms to keep the node n1 at VDDS level. The buffer 309c generates an output voltage at VDDS level. This keeps the PMOS transistor 308a inactivated. During receive mode, when there is undershoot voltage present at the pad 314, the capacitor 309a couples a voltage at the pad 314 to the node n1. A falling peak in the undershoot voltage generates a negative peak voltage at the node n1. An output voltage is generated by the buffer 309c when the negative peak voltage is below a lower defined threshold voltage of the buffer 309c. The output voltage generated by the buffer 309c is at VDD level. The output voltage is provided at the gate terminal of the PMOS transistor 308a to partially activate the PMOS transistor 308a. The PMOS transistor 308a is completely activated when the voltage at the gate terminal is at 0 volt. The partial activation of the PMOS transistor 308a causes a small current through resistor (Ro) 307, thereby creating a voltage drop across the resistor (Ro) 307. This reduces the stress on PMOS transistor 308a during the duration of the undershoot voltage at the pad 314. The output voltage generated by the buffer 309c is only for the duration when the negative peak voltage is below the lower defined threshold voltage of the buffer 309c i.e. the output voltage is only for the duration of the undershoot voltage. Therefore, the PMOS transistor 308a is partially activated only for the duration of the undershoot voltage. When the negative peak voltage is above the lower defined threshold voltage of the buffer 309c, the output voltage is inactivated, thus inactivating the PMOS transistor 308a. This maintains a proper logic on the pad 314 during steady state. Thus the PMOS protect circuit 309 eliminates the stress on the driver 308 without using any external reference voltage.

In the NMOS protect circuit 311, in an embodiment; the resistor 311b is of the order of mega-ohms to keep the node n2 at 0 voltage level. During receive mode, the second output (NC) 306 from the logic circuit 302 to the NMOS transistor 308b is inactivated. During receive mode, when there is overshoot voltage present at the pad 314, the capacitor 311a couples a voltage at the pad 314 to the node n2. A rising peak in the overshoot voltage generates a positive peak voltage at the node n2. An output voltage is generated by the buffer 311c when the positive peak voltage is above an upper defined threshold voltage of the buffer 311c. The output voltage generated by the buffer 311c is at VDD level. The output voltage is provided at the gate terminal of the NMOS transistor 308b to partially activate the NMOS transistor 308b. The NMOS transistor 308b is completely activated when the voltage at the gate terminal is VDDS 310. The partial activation of the NMOS transistor 308b causes a small current through resistor (Ro) 307, thereby creating a voltage drop across the resistor (Ro) 307. This reduces the stress on NMOS transistor 308b during the duration of the overshoot voltage at the pad 314. The output voltage is only for the duration when the positive peak voltage is above the upper defined threshold voltage of the buffer 311c i.e. the output voltage generated by the buffer 311c is only for the duration of the overshoot voltage. Therefore, the NMOS transistor 308b is partially activated only for the duration of the overshoot voltage. When the positive peak voltage is below the upper defined threshold voltage of the buffer 311c, the output voltage is inactivated, thus inactivating the NMOS transistor 308b. This maintains a proper logic on the pad 314 during steady state. Thus the NMOS protect circuit 311 eliminates the stress on the driver 308 without using any external reference voltage. The NMOS protect circuit 311 is non-responsive to the undershoot voltage at the pad 314. Similarly, the PMOS protect circuit 309 is non-responsive to the overshoot voltage at the pad 314.

The undershoot voltage is a voltage below a negative predefined threshold voltage and the overshoot voltage is a voltage above a positive predefined threshold voltage. In one embodiment, the positive predefined threshold voltage is equal to the IO supply voltage (VDDS) 310 and the negative predefined threshold voltage is equal to ground voltage (0V). The PMOS protect circuit 309 suppresses the undershoot voltage and the NMOS protect circuit 311 suppresses the overshoot voltage, thus eliminating the stress caused on the driver 308. One of the advantage of the IO circuit 300 is that the undershoot voltage suppression and the overshoot voltage suppression does not require additional reference voltage.

Figure 4:
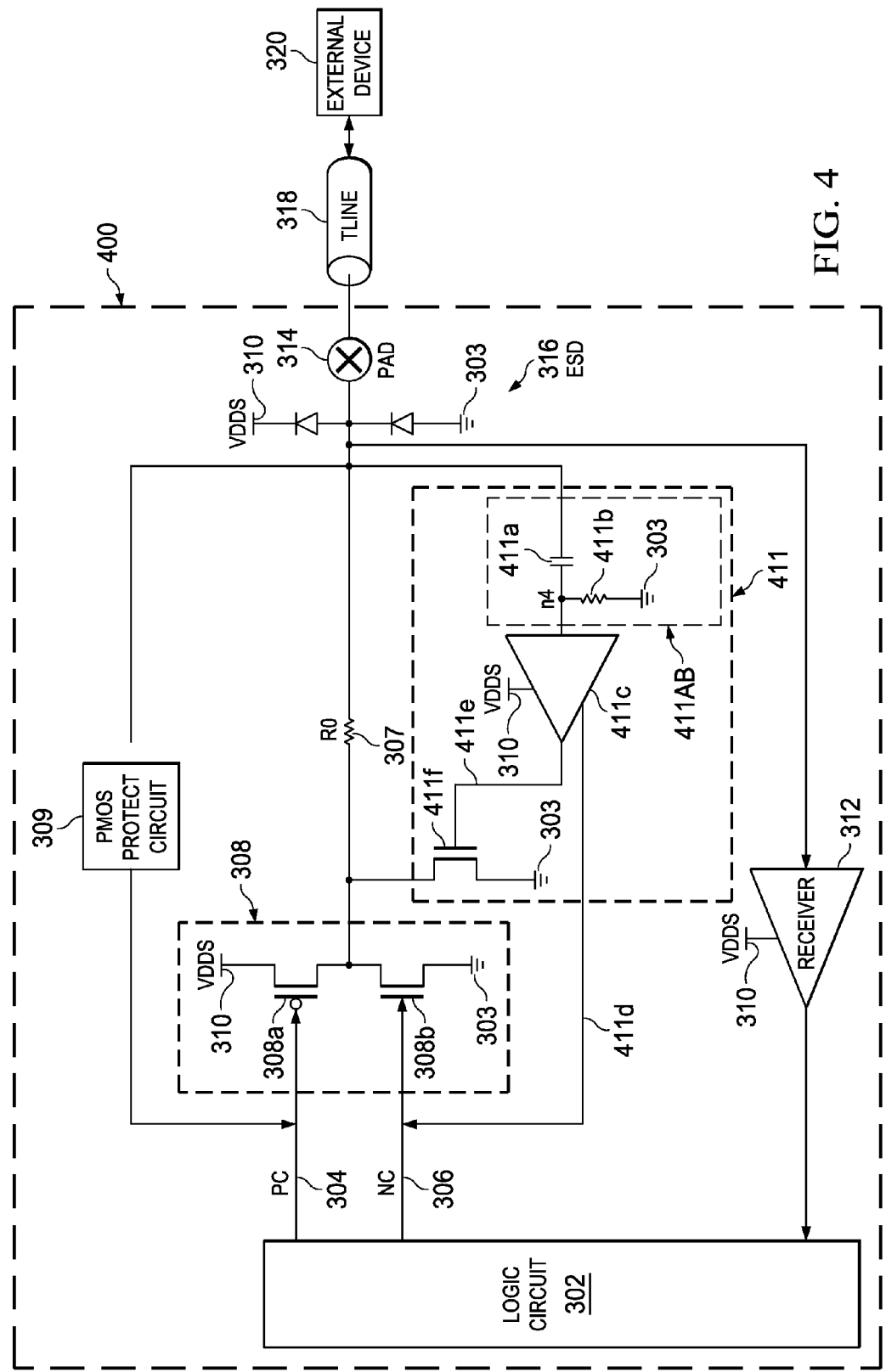
FIG. 4 illustrates a circuit schematic of an input/output (IO) circuit in an integrated circuit, according to an embodiment.

FIG. 4 illustrates a circuit schematic of an input/output (IO) circuit 400 in an integrated circuit, according to an embodiment. The input/output (IO) circuit 400 in an integrated circuit is similar in connection and operation to the input/output (IO) circuit 300 in an integrated circuit. The components of FIG. 4 that have identical reference numerals as those of FIG. 3 have same or similar functionalities as explained with respect to FIG. 3 and are therefore not explained again for brevity reasons. A PMOS (p-metal oxide semiconductor) protect circuit 309 is coupled to the pad 314 and the driver circuit 308. An NMOS (n-metal oxide semiconductor) protect circuit 411 is coupled to the pad 314 and the driver circuit 308. The PMOS protect circuit 309 is coupled to the pad 314 and the gate terminal of the PMOS transistor 308a. The NMOS protect circuit 411 is coupled to the pad 314 and the gate terminal of the NMOS transistor 308b. The NMOS protect circuit 411 includes an RC high pass filter 411AB. The RC high pass filter 411AB includes a capacitor 411a and a resistor 411b. The capacitor 411a is coupled to the pad 314. A node n4 is coupled to the capacitor 411a. The resistor 411b is coupled to the node n4. The resistor 411b is also coupled to the ground terminal 303. A buffer 411c is coupled to the node n4. The buffer 411c is coupled to the gate terminal of the NMOS transistor 308b through a path 411d. The buffer 411c is also coupled to a supplementary NMOS transistor 411f through the path 411e. The buffer 411c is coupled to a gate terminal of the supplementary NMOS transistor 411f. A drain terminal of the supplementary NMOS transistor 411f is coupled to the output of the driver circuit 308. The buffer 411c is configured to receive an IO supply voltage (VDDS) 310. The IO circuit 400 may include one or more additional components known to those skilled in the relevant art and are not discussed here for simplicity of the description.

The operation of the NMOS protect circuit 411 is explained now. In one embodiment, the NMOS protect circuit 411 is used when the core voltage (VDD) 305 is too low to activate the NMOS transistor 308b or VDD 305 is too high to completely activate the NMOS transistor 308b thus corrupting the logic at the pad 314. During receive mode, the second output (NC) 306 from the logic circuit 302 to the NMOS transistor 308b is inactivated. During receive mode, when there is overshoot voltage present at the pad 314, the capacitor 411a couples a voltage at the pad 314 to the node n4. Arising peak in the overshoot voltage generates a positive peak voltage at the node n4. An output voltage is generated by the buffer 411c on the path 411e when the positive peak voltage is above an upper defined threshold voltage of the buffer 411c. The output voltage generated by the buffer 411c is at VDDS level. The output voltage is provided on the path 411e to the gate terminal of the supplementary NMOS transistor 411f to activate the supplementary NMOS transistor 411f. The supplementary NMOS transistor 411f is completely activated on receiving the output voltage from the buffer 411c. This causes a small current through resistor (Ro) 307, thereby creating a voltage drop across the resistor (Ro) 307. In one embodiment, the size of supplementary NMOS transistor 411f is much lesser than NMOS transistor 308b such that it draws very less current when activated on receiving the overshoot voltage at the pad 314. This reduces the stress on NMOS transistor 308b during the duration of the overshoot voltage at the pad 314. Also, the buffer 411c generates a 0 volt signal on the path 411d to inactivate the NMOS transistor 308b. The output voltage generated by the buffer 411c is only for the duration when the positive peak voltage is above the upper defined threshold voltage of the buffer i.e. the output voltage is only for the duration of the overshoot voltage. Therefore, the supplementary NMOS transistor 411f is activated only for the duration of the overshoot voltage. When the positive peak voltage is below the upper defined threshold voltage of the buffer 411c, the output voltage is inactivated, thus inactivating the supplementary NMOS transistor 411f. This maintains a proper logic on the pad 314 during steady state. Thus the NMOS protect circuit 411 eliminates the stress on the driver 308 without using any external reference voltage.

Figure 5:
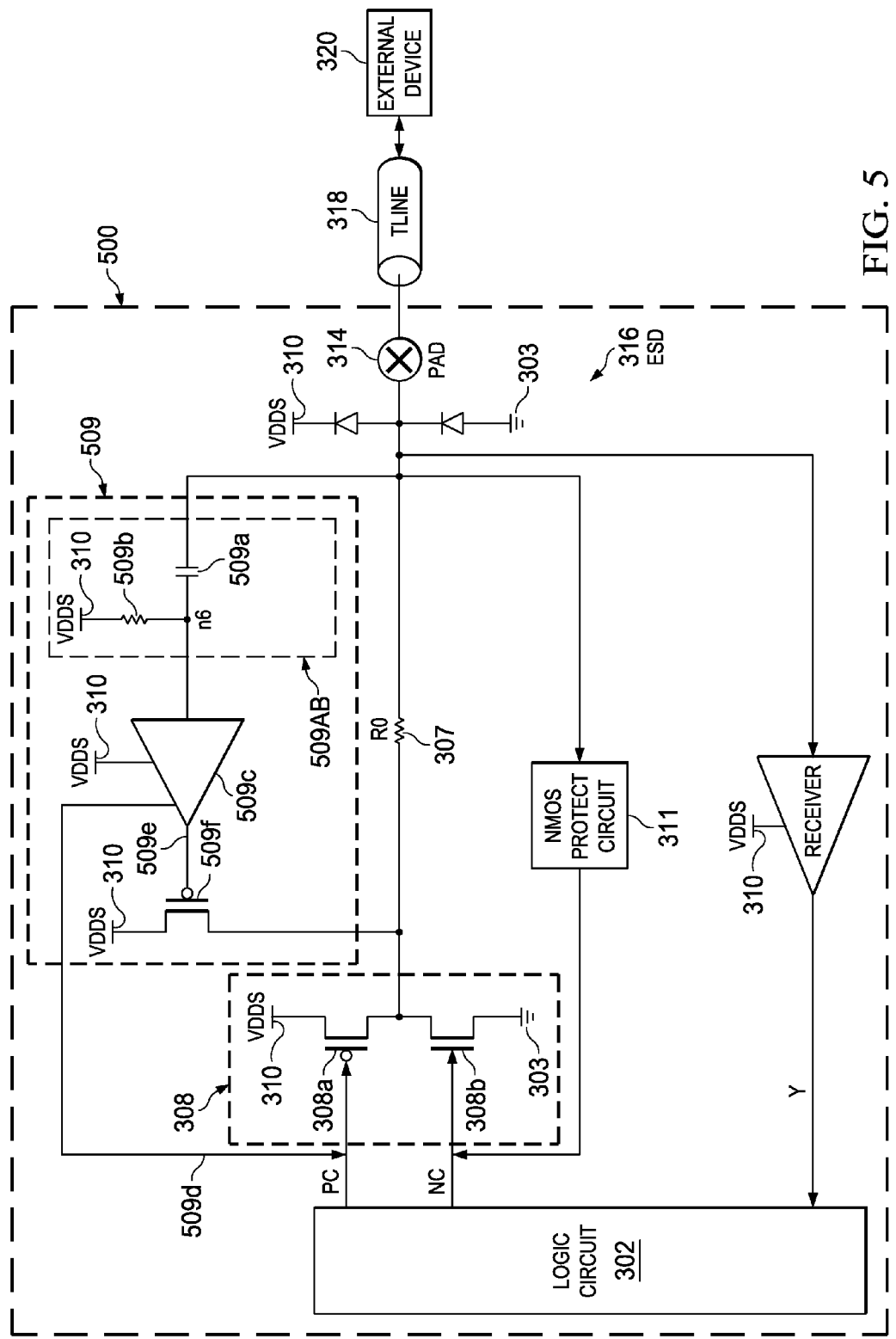
FIG. 5 illustrates a circuit schematic of an input/output (IO) circuit in an integrated circuit, according to an embodiment.

FIG. 5 illustrates a circuit schematic of an input/output (IO) circuit 500 in an integrated circuit, according to an embodiment. The input/output (IO) circuit 500 in an integrated circuit is similar in connection and operation to the input/output (IO) circuit 300 in an integrated circuit. The components of FIG. 5 that have identical reference numerals as those of FIG. 3 have same or similar functionalities as explained with respect to FIG. 3 and are therefore not explained again for brevity reasons. A PMOS (p-metal oxide semiconductor) protect circuit 509 is coupled to the pad 314 and the driver circuit 308. An NMOS (n-metal oxide semiconductor) protect circuit 311 is coupled to the pad 314 and the driver circuit 308. The PMOS protect circuit 509 is coupled to the pad 314 and the gate terminal of the PMOS transistor 308a. The NMOS protect circuit 311 is coupled to the pad 314 and the gate terminal of the NMOS transistor 308b. The PMOS protect circuit 509 includes an RC high pass filter 509AB. The RC high pass filter 509AB includes a capacitor 509a and a resistor 509b. The capacitor 509a is coupled to the pad 314. A node n6 is coupled to the capacitor 509a. The resistor 509b is coupled to the node n6. The resistor 509b is also coupled to VDDS 310. A buffer 509c is coupled to the node n6. The buffer 509c is coupled to the gate terminal of the PMOS transistor 308a through a path 509d. The buffer 509c is also coupled to a supplementary PMOS transistor 509f through the path 509e. The buffer 509c is coupled to a gate terminal of the supplementary PMOS transistor 509f. A drain terminal of the supplementary PMOS transistor 509f is coupled to the output of the driver circuit 308. The buffer 509c is configured to receive an IO supply voltage (VDDS) 310. The IO circuit 500 may include one or more additional components known to those skilled in the relevant art and are not discussed here for simplicity of the description.

The operation of the PMOS protect circuit 509 is explained now. In one embodiment, the PMOS protect circuit 509 is used when the core voltage (VDD) 305 is too high to activate the PMOS transistor 308a or VDD 305 is too low to completely activate the PMOS transistor 308a thus corrupting the logic at the pad 314. During receive mode, when there is undershoot voltage present at the pad 314, the capacitor 509a couples a voltage at the pad 314 to the node n6. A falling peak in the undershoot voltage generates a negative peak voltage at the node n6. An output voltage is generated by the buffer 509c when the negative peak voltage is below a lower defined threshold voltage of the buffer 509c. The output voltage generated by the buffer 509c during undershoot is at 0 voltage level. The output voltage is provided on the path 509e to the gate terminal of the supplementary PMOS transistor 509f to activate the supplementary PMOS transistor 509f. The supplementary PMOS transistor 509f is completely activated on receiving the output voltage from the buffer 509c. The activation of the supplementary PMOS transistor 509f causes a small current through resistor (Ro) 307, thereby creating a voltage drop across the resistor (Ro) 307. In one embodiment, the size of supplementary PMOS transistor 509f is much lesser than PMOS transistor 308a such that it draws very less current when activated on receiving the undershoot voltage at the pad 314 This reduces the stress on PMOS transistor 308a during the duration of the undershoot voltage at the pad 314. Also, the buffer 509c generates a VDDS signal on the path 509d to inactivate the PMOS transistor 308a. The output voltage generated by the buffer 509c on the path 509e is only for the duration when the negative peak voltage is below the lower defined threshold voltage of the buffer i.e. the output voltage is only for the duration of the undershoot voltage. Therefore, the supplementary PMOS transistor 509f is activated only for the duration of the undershoot voltage. When the negative peak voltage is above the lower defined threshold voltage of the buffer, the output voltage is inactivated, thus inactivating the supplementary PMOS transistor 509f. This maintains a proper logic on the pad 314 during steady state. Thus, the PMOS protect circuit 509 eliminates the stress on the driver 308 without using any external reference voltage.

Figure 6:
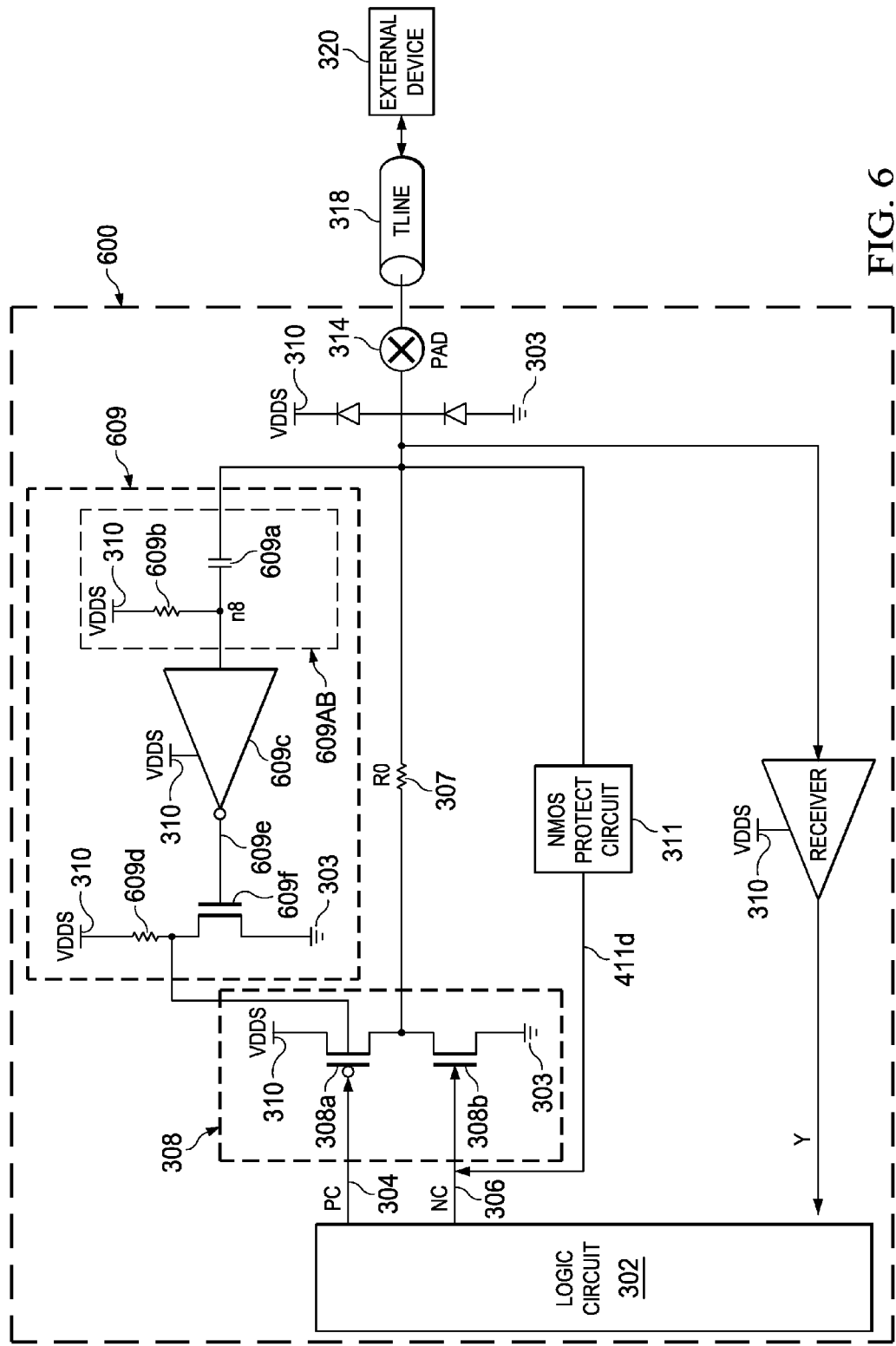
FIG. 6 illustrates a circuit schematic of an input/output (IO) circuit in an integrated circuit, according to an embodiment.

FIG. 6 illustrates a circuit schematic of an input/output (IO) circuit 600 in an integrated circuit, according to an embodiment. The input/output (IO) circuit 600 in an integrated circuit is similar in connection and operation to the input/output (IO) circuit 300 in an integrated circuit. The components of FIG. 6 that have identical reference numerals as those of FIG. 3 have same or similar functionalities as explained with respect to FIG. 3 and are therefore not explained again for brevity reasons. A PMOS (p-metal oxide semiconductor) protect circuit 609 is coupled to the pad 314 and the driver circuit 308. An NMOS (n-metal oxide semiconductor) protect circuit 311 is coupled to the pad 314 and the driver circuit 308. The PMOS protect circuit 609 includes an RC high pass filter 609AB. The RC high pass filter 609AB includes a capacitor 609a and a resistor 609b. The capacitor 609a is coupled to the pad 314. A node n8 is coupled to the capacitor 609a. The resistor 609b is coupled to the node n8. The resistor 609b is also coupled to VDDS 310. An inverter 609c is coupled to the node n8. The inverter 609c is configured to receive the IO supply voltage (VDDS) 310. The inverter 609c is also coupled to an auxiliary NMOS transistor 609f. A gate terminal of the auxiliary NMOS transistor 609f receives an output of the inverter 609c. A drain terminal of the auxiliary NMOS transistor 609f receives VDDS 310 through a resistor 609d. In one embodiment, the resistance of the resistor 609d is in order of Kilo-ohms. The drain terminal of the auxiliary NMOS transistor 609f is coupled to a bulk terminal of the PMOS transistor 308a. A source terminal of the auxiliary NMOS transistor 609f is coupled to a ground terminal. The IO circuit 600 may include one or more additional components known to those skilled in the relevant art and are not discussed here for simplicity of the description.

The operation of the PMOS protect circuit 609 is explained now. In one embodiment, the PMOS protect circuit 609 is used to reduce drain-bulk stress of PMOS transistor 308a. The drain-bulk stress becomes much worse with undershoot voltages at the pad 314 causing high stress and thus increasing the failure rate of IO circuits. During receive mode, when there is undershoot voltage present at the pad 314, the capacitor 609a couples a voltage at the pad 314 to the node n8. A falling peak in the undershoot voltage generates a negative peak voltage at the node n8. The inverter 609c generates a positive peak voltage on receiving the negative peak voltage at the node n8. Thus, the auxiliary NMOS transistor 609f is activated which causes a current to flow through resistor 609d, and hence creating a voltage drop across the resistor 609d. This reduces the stress on PMOS transistor 308a by reducing a voltage drop across the drain-bulk of the PMOS transistor 308a during the duration of the undershoot voltage at the pad 314. The positive peak voltage generated by the inverter 609c is only for the duration of the undershoot voltage at the pad 314. Therefore, the auxiliary NMOS transistor 609f is activated only for the duration of the undershoot voltage. Thus, the resistor 609d in combination with the inverter 609c is configured to reduce stress of the PMOS transistor 308a. During receive mode, when there is overshoot present at the pad 314, the auxiliary NMOS transistor 609f will be inactivated thus maintaining the bulk terminal of the PMOS transistor 308a at VDDS level. This help in maintaining a proper logic on the pad 314 during steady state. Thus, the PMOS protect circuit 609 eliminates the stress on the driver 308 without using any external reference voltage.

Figure 7:
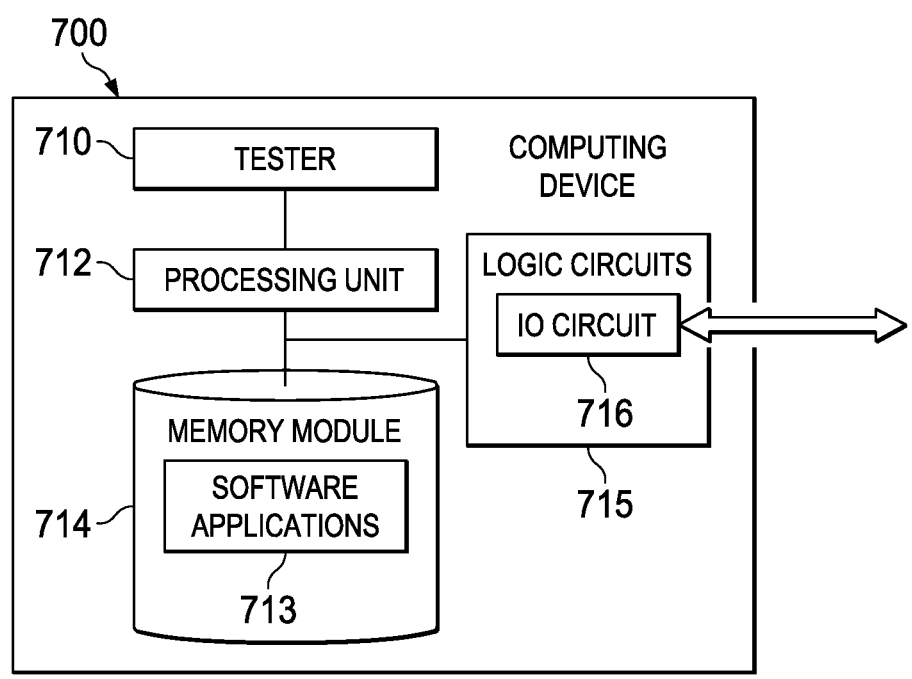
FIG. 7 illustrates a computing device according to an embodiment.

FIG. 7 illustrates a computing device according to an embodiment. The computing device 700 is, or is an integrated circuit incorporated into, a mobile communication device, such as a mobile phone, a personal digital assistant, a personal computer, or any other type of electronic system.

In some embodiments, the computing device 700 can be one of, but not limited to, microcontroller, microprocessor or a system-on-chip (SoC) which includes a processing unit 712 such as a CPU (Central Processing Unit), a memory unit 714 (e.g., random access memory (RAM)) and a tester 710. The processing unit 712 can be, for example, a CISC-type (Complex Instruction Set Computer) CPU, RISC-type CPU (Reduced Instruction Set Computer), or a digital signal processor (DSP). The memory module 714 (which can be memory such as RAM, flash memory, or disk storage) stores one or more software applications 713 (e.g., embedded applications) that, when executed by the processing unit 712, perform any suitable function associated with the computing device 700. The tester 710 comprises logic that supports testing and debugging of the computing device 700 executing the software application 713. For example, the tester 710 can be used to emulate a defective or unavailable component(s) of the computing device 700 to allow verification of how the component (s), were it actually present on the computing device 700, would perform in various situations (e.g., how the component (s) would interact with the software application 713). In this way, the software application 713 can be debugged in an environment which resembles post-production operation.

The processing unit 712 typically comprises cache-memory and logic which store and use information frequently accessed from the memory module 714 and is responsible for the complete functionality of the computing device. The computing device 700 includes a plurality of logic circuits 715. At least one logic circuit of the plurality of logic circuits includes an IO circuit 716. The IO circuit 716 acts as an interface between the computing device 700 and the external world. The IO circuit 716 is analogous to at least one of the IO circuit 300, 10 circuit 400, 10 circuit 500 and IO circuit 600 in connection and operation. The IO circuit 716 eliminates the stress on a driver without using an additional reference voltage source during the receive mode.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections. Further, the term "logic-HIGH" is generally intended to describe a signal that is at logic state "1," and the term "logic-LOW" is generally intended to describe a signal that is at logic state "0." Also, the terms "inactivation" or "inactivated" or turn "OFF" or turned "OFF" is used to describe a deactivation of a device, a component or a signal. The terms "activation" or "activated" or turned "ON" describes activation of a device, a component or a signal.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Further, the described features, advantages, and characteristics of the disclosure may be combined in any suitable manner in one or more embodiments. One skilled in the relevant art will recognize that the disclosure can be practiced without one or more of the specific features or advantages of a particular embodiment. In other instances, additional features and advantages may be recognized in certain embodiments that may not be present in all embodiments of the disclosure.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. An input/output (IO) circuit in an integrated circuit comprising:
   a logic circuit;
   a driver circuit coupled to the logic circuit;
   a pad coupled to the driver circuit;
   a PMOS protect circuit coupled to the driver circuit and the pad; and
   an NMOS protect circuit coupled to the driver circuit and the pad, and at least one of the NMOS protect circuit and the PMOS circuit comprising a high pass filter, wherein the PMOS protect circuit is configured to be activated when a undershoot voltage is received at the pad during a receive mode and the NMOS protect circuit is configured to be activated when a overshoot voltage received at the pad during the receive mode of the IO circuit;
   wherein the NMOS protect circuit further comprises:
   an RC high pass filter coupled to the pad; and
   a buffer coupled to the RC high pass filter and configured to generate an output voltage, the output voltage is provided to the gate terminal of the NMOS transistor to partially activate the NMOS transistor, wherein the output voltage is generated from the overshoot voltage received at the pad during the receive mode.

2. The IO circuit of claim 1, wherein the overshoot voltage is a voltage above a positive predefined threshold and the undershoot voltage is a voltage a below a negative predefined threshold.

3. The IO circuit of claim 1, wherein the driver circuit comprises a PMOS transistor and an NMOS transistor and the logic circuit is configured to provide a first output at a gate terminal of the NMOS transistor and a second output at a gate terminal of the PMOS transistor.

4. The IO circuit of claim 1, wherein a drain terminal of the PMOS transistor and a drain terminal of the NMOS transistor are coupled to generate an output of the driver circuit.

5. The IO circuit of claim 1 further comprises:
   a resistor configured to receive the output of the driver circuit and coupled to the pad; and
   an ESD (electro-static discharge) clamp circuit coupled to the PAD.

6. The IO circuit of claim 1, wherein the PMOS protect circuit is coupled to the pad and the gate terminal of the PMOS transistor and the NMOS protect circuit is coupled to the pad and the gate terminal of the NMOS transistor.

7. The IO circuit of claim 1, wherein the NMOS protect circuit further comprises:
   an RC high pass filter coupled to the pad; and
   a buffer coupled to the RC high pass filter and configured to generate an output voltage, the output voltage is provided to a gate terminal of a supplementary NMOS transistor to activate the supplementary NMOS transistor, the output voltage is generated from the overshoot voltage received at the pad during the receive mode and, wherein the buffer is configured to inactivate the NMOS transistor.

8. The IO circuit of claim 1, wherein the PMOS protect circuit further comprises:
   an RC high pass filter coupled to the pad; and
   a buffer coupled to the RC high pass filter and configured to generate an output voltage, the output voltage is provided to the gate terminal of the PMOS transistor to partially activate the PMOS transistor, wherein the output voltage is generated from the undershoot voltage received at the pad during the receive mode.

9. The IO circuit of claim 1, wherein the PMOS protect circuit further comprises:
   an RC high pass filter coupled to the pad; and
   a buffer coupled to the RC high pass filter and configured to generate an output voltage, the output voltage is provided to a gate terminal of a supplementary PMOS transistor to activate the supplementary PMOS transistor, the output voltage is generated from the undershoot voltage received at the pad during the receive mode and, wherein the buffer is configured to inactivate the PMOS transistor.

10. The IO circuit of claim 1, wherein the PMOS protect circuit further comprises:
    an RC high pass filter coupled to the pad;
    an inverter coupled to the RC high pass filter and configured to generate a positive peak voltage, the positive peak voltage is provided to a gate terminal of an auxiliary NMOS transistor to activate the auxiliary NMOS transistor, the positive peak voltage is generated from the undershoot voltage received at the pad;
    a resistor coupled to a source terminal of the auxiliary NMOS transistor and configured to receive an IO (input/output) supply voltage; and a bulk terminal of the PMOS transistor coupled to the source terminal of the auxiliary NMOS transistor, such that the resistor in combination with the inverter is configured to reduce stress of the PMOS transistor.

11. The IO circuit of claim 1, wherein a source terminal of the PMOS transistor and a source terminal of the supplementary PMOS transistor are configured to receive the IO supply voltage and a source terminal of the NMOS transistor and a source terminal of the supplementary NMOS transistor are coupled to a ground terminal.

12. The IO circuit of claim 1, wherein a drain terminal of the supplementary PMOS transistor and a drain terminal of the supplementary NMOS transistor are coupled to the output of the driver circuit.

13. The IO circuit of claim 1, wherein the NMOS protect circuit is configured to be activated only for a duration of the overshoot voltage during the receive mode and the PMOS protect circuit is configured to be activated only for a duration of the undershoot voltage during the receive mode.

14. An input/output (IO) circuit in an integrated circuit that receives an overshoot voltage and an undershoot voltage in a receive mode, the IO circuit comprising:
a driver circuit, the driver circuit comprises an NMOS transistor coupled to a PMOS transistor;
a pad coupled to an output of the driver circuit, wherein a drain terminal of the PMOS transistor and a drain terminal of the NMOS transistor are coupled to generate the output of the driver circuit;
a PMOS protect circuit coupled to the pad and a gate terminal of the PMOS transistor; and
an NMOS protect circuit coupled to the pad and a gate terminal of the NMOS transistor,
wherein the NMOS protect circuit is configured to be activated only for a duration of the overshoot voltage received at the pad during the receive mode and the PMOS protect circuit is configured to be activated only for a duration of the undershoot voltage received at the pad during the receive mode.

15. The IO circuit of claim 14, wherein:
the NMOS protect circuit further comprising an RC high pass filter coupled to the pad, and a buffer coupled to the RC high pass filter and configured to generate an output voltage, the output voltage is provided to the gate terminal of the NMOS transistor to partially activate the NMOS transistor, wherein the output voltage is generated from a overshoot voltage received at the pad during the receive mode; and
the PMOS protect circuit further comprising an RC high pass filter coupled to the pad, and a buffer coupled to the RC high pass filter and configured to generate an output voltage, the output voltage is provided to the gate terminal of the PMOS transistor to partially activate the PMOS transistor, wherein the output voltage is generated from a undershoot voltage received at the pad during the receive mode.

16. A method for protecting an input/output (IO) circuit when functioning in a receive mode, the IO circuit comprising an NMOS transistor and a PMOS transistor, the method comprising:

clamping an overshoot voltage and an undershoot voltage received at a pad;
activating an NMOS protect circuit for a duration of the overshoot voltage received at the pad, the NMOS protect circuit coupled to the pad and a gate terminal of the NMOS transistor; and
activating a PMOS protect circuit for a duration of the undershoot voltage received at the pad, the PMOS protect circuit coupled to the pad and a gate terminal of the PMOS transistor.

17. The method of claim 16, wherein activating the NMOS protect circuit comprises:
generating a positive peak voltage from the overshoot voltage received at the pad;
generating an output voltage when the positive peak voltage is above an upper defined threshold voltage; and
providing the output voltage at the gate terminal of the NMOS transistor to partially activate the NMOS transistor.

18. The method of claim 16, wherein activating the NMOS protect circuit comprises:
generating a positive peak voltage from the overshoot voltage received at the pad;
generating an output voltage when the positive peak voltage is above an upper defined threshold voltage;
providing the output voltage at the gate terminal of a supplementary NMOS transistor to activate the supplementary NMOS transistor; and
inactivating the NMOS transistor.

19. The method of claim 16, wherein activating the PMOS protect circuit comprises:
generating a negative peak voltage from the undershoot voltage received at the pad;
generating an output voltage when the negative peak voltage is below a lower defined threshold voltage; and
providing the output voltage at the gate terminal of the PMOS transistor to partially activate the PMOS transistor.

20. The method of claim 16, wherein activating the PMOS protect circuit comprises:
generating a negative peak voltage from the undershoot voltage received at the pad;
generating an output voltage when the negative peak voltage is below a lower defined threshold voltage;
providing the output voltage at the gate terminal of a supplementary PMOS transistor to activate the supplementary PMOS transistor; and
inactivating the PMOS transistor.

21. The method of claim 16, wherein activating the PMOS protect circuit comprises:
generating a negative peak voltage from the undershoot voltage received at the pad;
generating a positive peak voltage from the negative peak voltage;
providing the positive peak voltage at the gate terminal of a auxiliary NMOS transistor to activate the auxiliary NMOS transistor such that a drain-bulk stress of the PMOS transistor is reduced.

* * * * *